(12) United States Patent
Jang et al.

(10) Patent No.: US 7,610,530 B2
(45) Date of Patent: Oct. 27, 2009

(54) TEST DATA GENERATOR, TEST SYSTEM AND METHOD THEREOF

(75) Inventors: Jin-Mo Jang, Suwon-si (KR);
Young-Bu Kim, Seongnam-si (KR);
Du-Sik Yoo, Hwaseong-si (KR);
Byung-Wook Ahn, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 407 days.

(21) Appl. No.: 11/508,177

(22) Filed: Aug. 23, 2006

(65) Prior Publication Data
US 2007/0061656 A1 Mar. 15, 2007

(30) Foreign Application Priority Data
Aug. 24, 2005 (KR) .................. 10-2005-0078044

(51) Int. Cl.
*G01R 31/3183* (2006.01)
*G01R 31/40* (2006.01)
(52) U.S. Cl. .................... 714/724; 714/738
(58) Field of Classification Search .................... None
See application file for complete search history.

(56) References Cited

U.S. PATENT DOCUMENTS 3,462,999 A * 8/1969 Fultz et al. ............... 73/664
6,169,408 B1 * 1/2001 Kantor et al. ............ 324/752
6,381,269 B1 * 4/2002 Gradl et al. .............. 375/224
2004/0133834 A1 7/2004 Kanemitsu et al. ........ 714/742
2006/0146318 A1 * 7/2006 Adam et al. ............. 356/237.1

FOREIGN PATENT DOCUMENTS

| JP | 08-062298 | 3/1996 |
| JP | 08-062299 | 3/1996 |
| JP | 2001-289915 | 10/2001 |
| KR | 10-2003-0049481 | 6/2003 |

OTHER PUBLICATIONS

Korean Office Action dated Sep. 26, 2006 for counterpart Korean Application No. 10-2005-0078044 with English translation.

* cited by examiner

*Primary Examiner*—Kevin L Ellis
*Assistant Examiner*—Dipakkumar Gandhi
(74) *Attorney, Agent, or Firm*—Harness, Dickey & Pierce

(57) ABSTRACT

A test data generator, test system and method thereof are provided. In the example method, parallel test data may be received at a first data rate. The received parallel test data may be converted into serial test data at a second data rate. Noise (e.g., jitter noise, level noise, etc.) may be selectively inserted into the converted serial test data. The noise inserted into the serial test data, which may be configured to operate at a higher data rate than the parallel test data, may allow a device to be tested with higher data-rate test data. The example method may be performed by the example test data generator and/or by the example test system.

31 Claims, 6 Drawing Sheets

TEST DATA GENERATOR, TEST SYSTEM AND METHOD THEREOF

PRIORITY STATEMENT

This application claims the benefit of Korean Patent Application No. 10-2005-0078044, filed on Aug. 24, 2005, in the Korean Intellectual Property Office, the disclosure of which is incorporated herein in its entirety by reference.

BACKGROUND OF THE INVENTION

1. Field of the Invention

Example embodiments of the present invention relate generally to a test data generator, test system and method thereof, and more particularly, to a test data generator, test system and method of inserting noise into test data.

2. Description of Related Art

In conventional data communication, higher speed data (e.g., being transmitted, being received, etc.) may be forwarded to a data communication system via a higher speed interface (HSI) functional block. In an example, the HSI functional block may be included in a functional block of the data communication system. Alternatively, the HSI functional block may be a single element in the system. In order to assess electrical characteristics of a conventional higher speed data communication system, output signals from the higher speed data communication system may be examined in response to a higher speed test data signal applied through the HSI functional block.

Generally, automatic test equipment (ATE) may be used to test electrical characteristics of a device under test (DUT). Electrical characteristics of the DUT may be assessed by applying a power supply voltage, input signals, and control signals from the ATE to the DUT, and measuring the electrical characteristics of the signals output from the DUT in response to the applied signals.

In order to test a data transmit/receive capability of the HSI functional block included in the DUT by using the ATE, the ATE may generate test data equivalent to "real", or non-test data, used in the DUT, and may forward the test data to a corresponding HSI functional block of the DUT. However, a speed of the test data generated by the ATE may be relatively limited (e.g., within a range from several hundreds MHz to several GHz). Accordingly, the ATE may not be capable of generating test data at higher data speeds (e.g., of "real" or non-test data, which may be several GHz to several tens GHz).

FIG. 1 illustrates a conventional test circuit 100. The test circuit 100 may be used to test a HSI functional block of a DUT. Referring to FIG. 1, the test circuit 100 may include an ATE 110 and an HSI functional block 120.

Referring to FIG. 1, the ATE 110 may transmit lower speed parallel test data T-data (e.g., in a range spanning several hundreds MHz to several GHz) to the HSI functional block 120. The HSI functional block 120 may transform the parallel data T-data into higher speed serial data (e.g., in a range spanning several GHz to several tens GHz) and may forward the higher speed serial data to input terminals Rx1 and Rx2.

Referring to FIG. 1, the HSI functional block 120 may forward data TO-data, which may be processed from the forwarded higher speed serial data received at the terminals Rx1 and Rx2, to the ATE 110. The ATE 110 may evaluate the received data TO-data to verify a function of a receiver unit arranged in a lower portion (e.g., below the dashed line) of the HSI functional block 120 of FIG. 1. However, while the conventional test circuit 100 of FIG. 1 may be capable of evaluating the function of the receiver unit of the HSI functional block 120, the test circuit 100 may not be capable of evaluating or verifying a function of a transmit unit of the HSI functional block 120 (e.g., which may be arranged in an upper portion, or above the dashed line, of the HSI functional block 120).

SUMMARY OF THE INVENTION

An example embodiment of the present invention is directed to a test data generator, including at least one noise insertion block receiving a first test input signal and adding noise to the first test input signal, in response to a first at least one noise control signal, to generate a first test noise signal.

Another example embodiment of the present invention is directed to a test system for testing electrical characteristics of a device, including a sample data generator generating serial test data at a first data rate based on parallel test data having a second data rate and outputting first and second test input signals having the first data rate, the first data rate higher than the second data rate and a test data generator receiving the first and second test input signals and generating first and second test noise signals by inserting noise into the first and second test input signals.

Another example embodiment of the present invention is directed to a method of testing a device, including receiving parallel test data at a first data rate, converting the received parallel test data into serial test data at a second data rate and selectively inserting at least one type of noise into the converted serial test data.

Another example embodiment of the present invention is directed to a higher speed test data generator capable of inserting noise by selectively inserting an appropriate level of noise to higher speed test signals.

Another example embodiment of the present invention is directed to an automatic test system including a higher speed test data generator capable of inserting noise.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
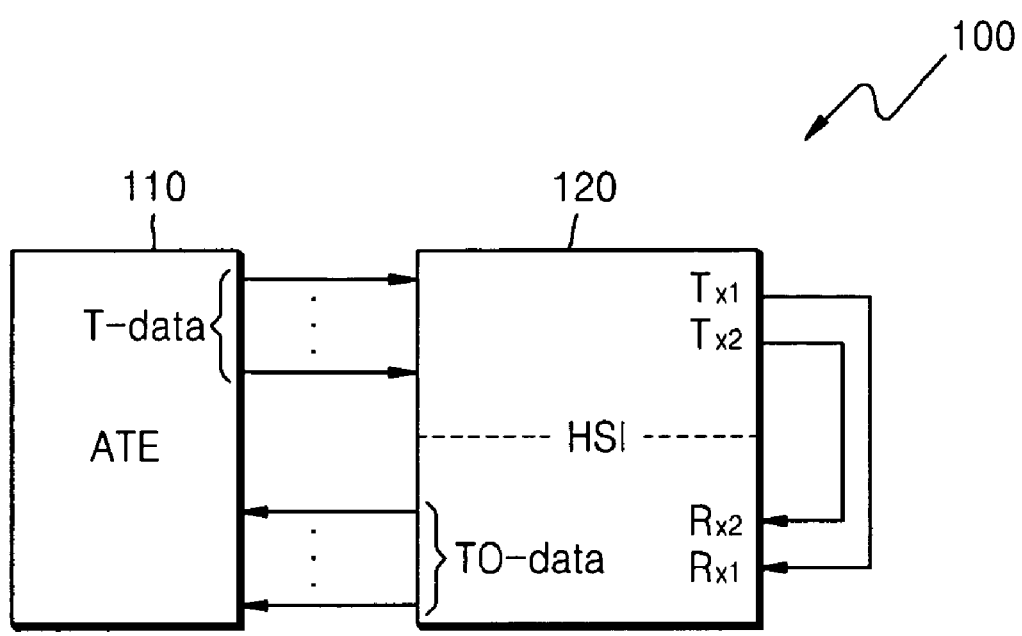
FIG. 1 illustrates a conventional test circuit.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
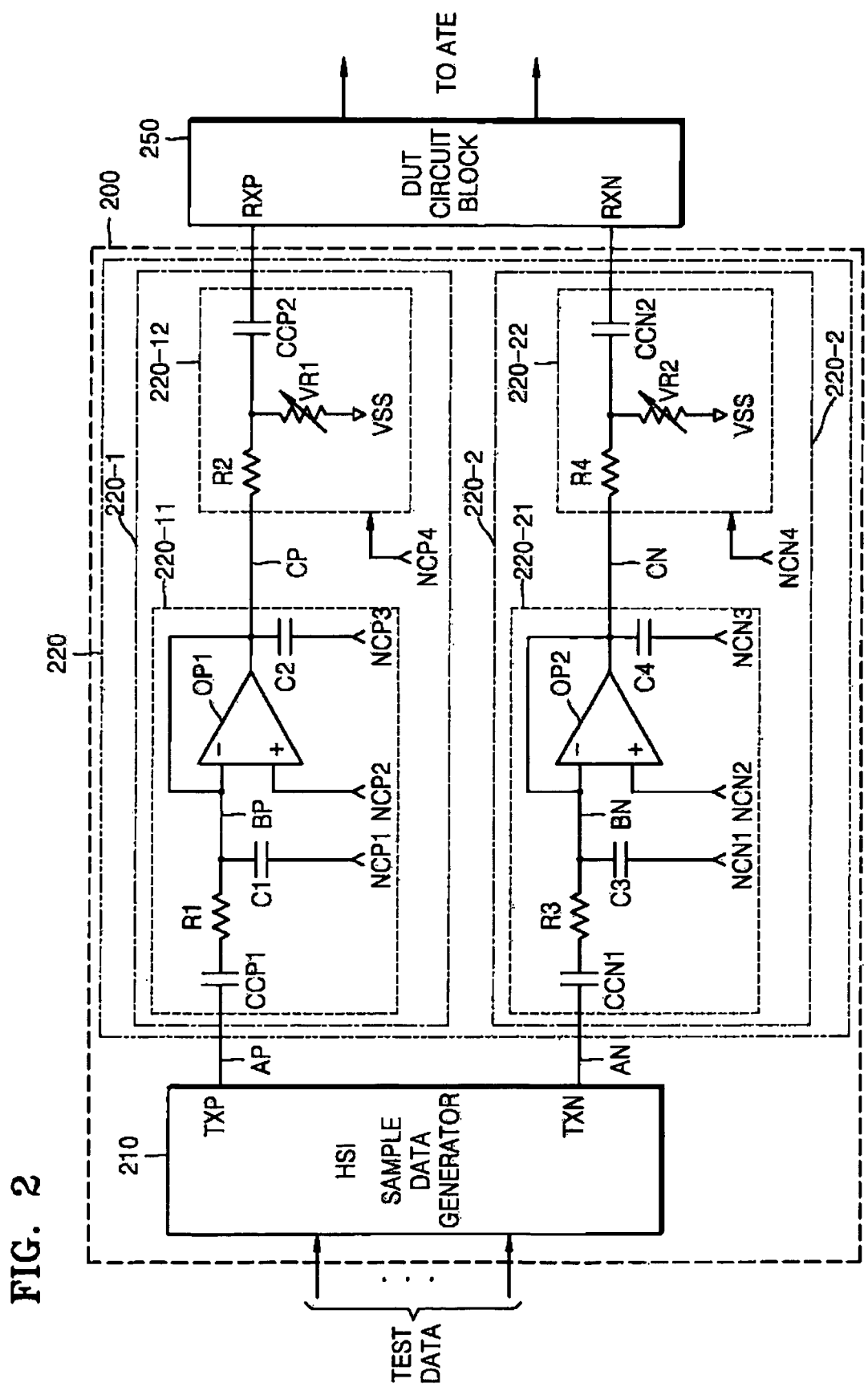
FIG. 2 illustrates a test data generator and a device under test (DUT) circuit block according to an example embodiment of the present invention.

FIG. 2 illustrates a test data generator 200 and a device under test (DUT) circuit block 250 according to an example embodiment of the present invention. In an example, the test data generator 200 may be a higher-speed test data generator capable of inserting or adding noise to generated test data.

In the example embodiment of FIG. 2, the test data generator 200 may include a higher speed interface (HSI) sample data generator 210 and a noise insertion block 220. The DUT circuit block 250 may be an internal circuit of a device under test (DUT) (not shown). The output of the DUT circuit block 250 may be transferred to automatic test equipment (ATE) (not shown) such that electrical characteristics of the DUT circuit block 250 may be inspected (e.g., evaluated for correctness) at the ATE.

In the example embodiment of FIG. 2, test data TEST DATA may be received from the ATE (not shown). The HSI sample data generator 210 may convert the test data TEST DATA, which may be input in parallel, into serial data signals, hereinafter referred to as first and second HSI test input signals TXP and TXN, respectively, with each of the first and second HSI test input signals TXP and TXN having opposite phases. In an example, although the test data TEST DATA may be received at a lower frequency (e.g., in a range spanning several hundreds MHz to several GHz), the first and second HSI test input signals TXP and TXN may each be set to a higher frequency (e.g., in a range spanning several GHz to several tens GHz). Hereinafter, the first and second HSI test input signals TXP and TXN may be alternatively referred to as output terminals of the HSI sample generator 210.

In the example embodiment of FIG. 2, the noise insertion block 220 may include a first noise insertion block 220-1 for inserting noise into the first HSI test input signal TXP to generate a first test noise signal RXP, and a second noise insertion block 220-2 for inserting noise into the second HSI test input signals TXN to generate a second test noise signal RXN. Hereinafter, the first and second test noise signals RXP and RXN may be alternatively referred to as input terminals of the DUT circuit block 250.

In the example embodiment of FIG. 2, the first noise insertion block 220-1 may include a first jitter noise insertion block 220-11 and a first level noise insertion block 220-12. The first jitter noise insertion block 220-11 may adjust slopes of rising and falling edges of the first test input signal TXP. In order to adjust the slopes, the first jitter noise insertion block 220-11 may include a first coupling capacitor CCP1, a first resistor R1, a first capacitor C1, a first operational amplifier OP1, and a second capacitor C2.

In the example embodiment of FIG. 2, the coupling capacitor CCP1 may include a first end receiving the first test input signal TXP. A first end of the first resistor R1 may be connected to a second end of the first coupling capacitor CCP1. A first end of the first capacitor C1 may be connected to a second end of the first resistor R1, and the first P noise control signal NCP1 may be applied to a second end of the first capacitor C1.

In the example embodiment of FIG. 2, in the first operational amplifier OP1 may, a first input (−) may be connected to a common node between the first resistance R1, the first capacitor C1 and an output terminal CP. A second P noise control signal NCP2 may be applied to a second input terminal (+) of the first operational amplifier OP1. A first end of the second capacitor C2 may be connected to the output terminal CP of the first operational amplifier OP1, and a second end of the second capacitor C2 may be connected to a third P noise control signal NCP3.

In the example embodiment of FIG. 2, the first level noise insertion circuit 220-12 may control a voltage level of the output signal of the first jitter noise insertion circuit 220-11. The first level noise insertion circuit 220-12 may include a second resistor R2, a first variable resistor VR1, and a second coupling capacitor CCP2.

In the example embodiment of FIG. 2, a first end of the second resistor R2 may be connected to the output terminal CP of the first operational amplifier OP1. The first variable resistor VR1 may have a variable resistance value that may change in response to a fourth P noise control signal NCP4. A first end of the first variable resistor VR1 may be connected to a second end of the second resistor R2, and a second end the first variable resistor VR1 may be connected to a first voltage source VSS. In an example, the first voltage source VSS may be a ground voltage. A first end of the second coupling capacitor CCP2 may be connected to a common node of the second resistor R2 and the first variable resistor VR1. The first test noise signal RXP may be output through a second end of the second coupling capacitor CCP2.

While the example embodiment of FIG. 2 illustrates the first jitter noise insertion circuit 220-11 and the first level noise insertion circuit 220-12 connected in series, other example embodiments of the present invention may deploy the first jitter noise insertion circuit 220-11 and the first level noise insertion circuit 220-12 separately (e.g., one without the other) or in a reversed order or sequence.

In the example embodiment of FIG. 2, the second noise insertion block 220-2 may include a second jitter noise insertion circuit 220-21 and a second level noise insertion circuit 220-22. The second jitter noise insertion circuit 220-21 may adjust slopes of rising and falling edges of the second test input signal TXN. The second jitter noise insertion circuit 220-21 may include a third coupling capacitor CCN1, a third resistor R3, a third capacitor C3, a second operational amplifier OP2, and a fourth capacitor C4.

In the example embodiment of FIG. 2, a first end of the third coupling capacitor CCN1 may receive the second test input signal TXN. A first end of the third resistor R3 may be connected to a second end of the third coupling capacitor CCN1. A first end of the third capacitor C3 may be connected to a second end of the third resistor R3, and a second end of the third capacitor C3 may be connected to a first N noise control signal NCN1.

In the example embodiment of FIG. 2, in the second operational amplifier OP2, the first input terminal (−) may be connected to a common node of the third resistor R3 and the third capacitor C3. A second N noise control signal NCN2 may be applied to the second input terminal (+). A first end of the fourth capacitor C4 may be connected to an output terminal of the second operational amplifier OP2. A third N noise control signal NCN3 may be applied to a second end of the fourth capacitor C4.

In the example embodiment of FIG. 2, the second level noise insertion circuit 220-22 may control a voltage level of the output signal of the second jitter noise insertion circuit 220-21. The second level noise insertion circuit 220-22 may include a fourth resistor R4, a second variable resistor VR2, and a fourth coupling capacitor CCN2.

In the example embodiment of FIG. 2, a first end of the fourth resistor R4 may be connected to the output terminal of the second operational amplifier OP2. The second variable resistor VR2 may have a variable resistance value that may change in response to a fourth noise control signal NCN4. A first end of the second variable resistor VR2 may be connected to a second end of the fourth resistor R4, and a second end of the second variable resistor VR2 may be connected to the voltage source VSS. In an example, the first voltage source VSS may be a ground voltage. A first end of the fourth coupling capacitor CCN2 may be connected to a common node between the fourth resistor R4 and the second variable resistor VR2 and a second end of the fourth coupling capacitor CCN2 may output the second test noise signal RXN.

Figure 3A:
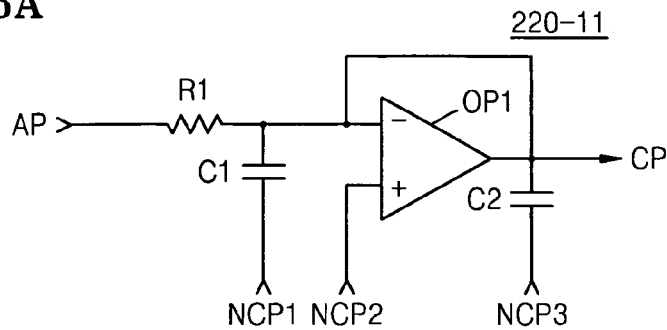
FIGS. 3A to 3B are circuit diagrams illustrating first and second jitter noise insertion circuits according to example embodiments of the present invention.
Figure 3B:
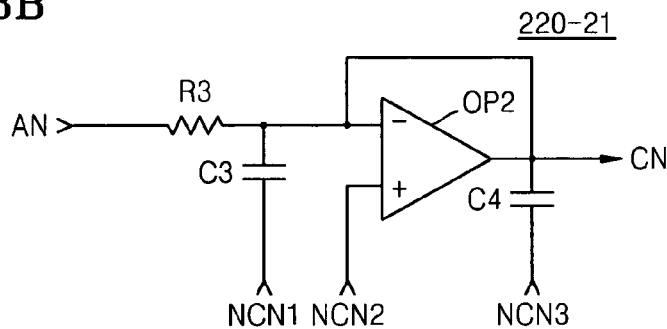

FIGS. 3A to 3B are circuit diagrams illustrating the first and second jitter noise insertion circuits 220-11 and 220-21 of FIG. 2 according to example embodiments of the present invention.

Figure 3C:
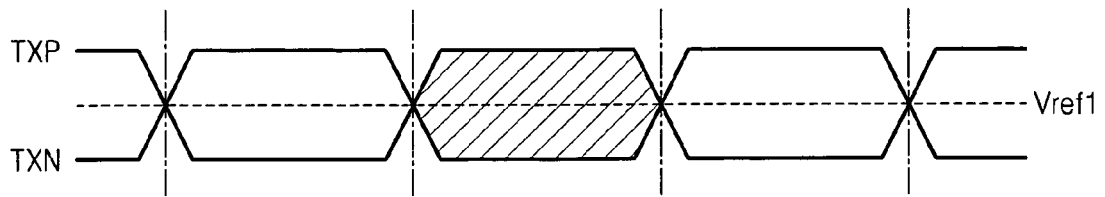
FIG. 3C is a waveform view illustrating first and second test input signals at two nodes according to another example embodiment of the present invention.

FIG. 3C is a waveform view illustrating the first and second test input signals TXP and TXN at two nodes AP and AN of FIG. 2 according to another example embodiment of the present invention.

Figure 3D:
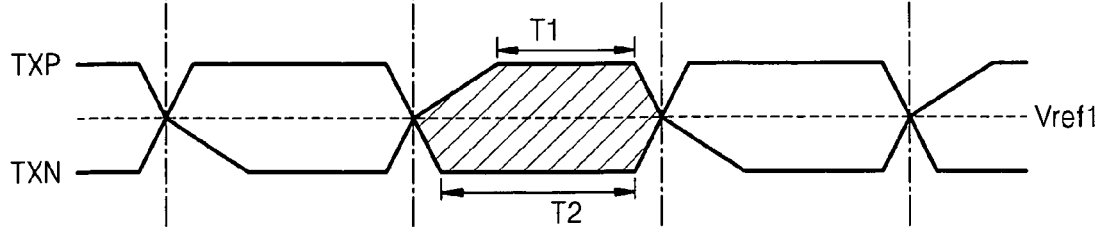
FIG. 3D is a waveform view illustrating the first and second test input signals according to another example embodiment of the present invention.

FIG. 3D is a waveform view illustrating the first and second test input signals TXP and TXN at two nodes CP and CN of FIG. 2 according to another example embodiment of the present invention.

In the example embodiments of FIGS. 3A through 3D, voltage levels of the second P noise control signal NCP2 and the second N noise control signal NCN2 may be the same and voltage levels of the first P noise control signal NCP1 and the first N noise control signal NCN1 may not be the same.

Referring again to the example embodiment of FIG. 2, the coupling capacitors CCP1, CCP2, CCN1, and CCN2 may reduce (e.g., cut off) DC components included in the input signals. A further description of the coupling capacitors CCP1, CCP2, CCN1, and CCN2 shall be omitted for the sake of brevity. It may be assumed that the AP node and the AN node of FIG. 2 are connected to respective ends of the first and third resistor R1 and R3 of FIGS. 3A and 3B. It may be further assumed that the second P noise control signal NCP2 and the second N noise control signal NCN2 of FIGS. 3A and 3B may be biased by a first reference signal Vref1. In an example, the first reference signal Vref1 may be an intermediate voltage of the signals input to the AP and AN nodes. Therefore, it will be appreciated by those of ordinary skill in the art that the negative feedback operational amplifiers OP1 and OP2 may function as buffers.

In the example embodiment of FIG. 3C, the voltage level of the first P noise control signal NCP1 may be the same as the first N noise control signal NCN1. Within the example embodiment of FIG. 3C, a shaded portion may represent an ideal eye pattern. Although response characteristics of the HSI functional block 120 may be tested using "real" (e.g., non-test) communication data, response characteristics of the HSI functional block may typically be tested by using digital test signals (e.g., to simplify a testing process). Accordingly, digital test signals may be used to test the HSI functional block 120 and results of the test may be used to evaluate response characteristics of the HSI functional block 120.

The eye pattern (e.g., the shaded portion) illustrated in the example embodiment of FIG. 3C may be symmetrical with respect to a dotted horizontal line as well as a dotted vertical line passing through a center point of the eye pattern. The illustrated symmetry is intended to show that activation time intervals of the first and second test input signals TXP and TXN in HSI functional block may be the same. In the example embodiment of FIG. 3A, response characteristics of the signal output to the CP node for the input signal of the AP node may vary based on the voltage level of the first P noise control signal NCP1. For example, if the voltage level of the first noise control signal NCN1 is constant, and the voltage level of the first P noise control signal NCP1 is lower than that of the first N noise control signal NCN1, the slope of the edge of the first test input signal TXP may decrease, as shown in the example embodiment of FIG. 3D. Accordingly, because the edge of the second test input signal TXN may be the same as that shown in the example embodiment of FIG. 3C, the eye pattern illustrated in the example embodiment of FIG. 3D may have a different shape than the eye pattern of FIG. 3C.

Accordingly, the eye pattern illustrated in the example embodiment of FIG. 3D may not be symmetrical. In the example embodiment of FIG. 3D, an activation time interval T1 of the first test input signal TXP may be shorter than the activation time interval T2 of the second test input signal TXN. The signal illustrated in the example embodiment of FIG. 3D may include a jitter noise component, in contrast with the signal shown in FIG. 3C.

In the example embodiment of FIG. 3A, the second capacitor C2, the first end of which may be connected to the output terminal CP of the first operational amplifier OP1, may delay the first test input signal TXP at the CP node based on the voltage level of the third P noise control signal NCP3 applied to the second end of the second capacitor C2. Likewise, in the example embodiment of FIG. 3B, the fourth capacitor C4, the first end of which may be connected to the output terminal CN of the second operational amplifier OP2, may delay the second test input signal TXN at the CN node based on the voltage level of the third N noise control signal NCN3 applied to the second end of the fourth capacitor C4.

Although the above description of the example embodiment of FIG. 3D may assume that the voltage level of the first noise control signal NCN1 is constant, and the voltage level of the first P noise control signal NCP1 may be lower than the first N noise control signal NCN1, other example embodiments of the present invention may be directed to different assumptions. For example, in another example embodiment of the present invention, the first test input signal TXP may be held constant, and an edge of the second test input signal TXN may be decreased.

In the example embodiments of FIGS. 3D, response characteristics for a signal mixed with jitter noise in the HSI functional block 120 of FIG. 2 (e.g., that may receive/transmit data in at higher speeds may be tested by applying test digital signals (e.g., as shown in FIG. 3D) to the HSI functional block 120.

Figure 4A:
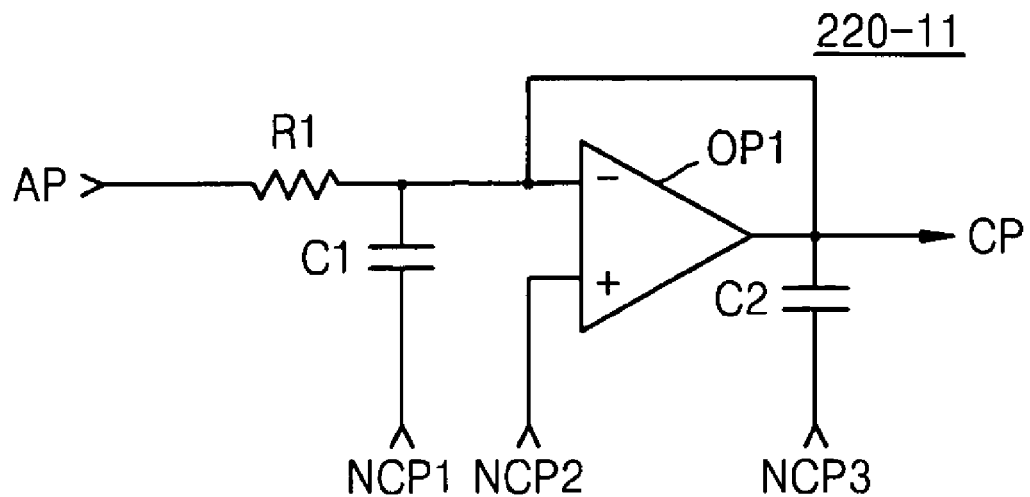
FIG. 4A is a circuit diagram illustrating the first jitter noise insertion block of FIG. 3A according to an example embodiment of the present invention.

FIG. 4A is a circuit diagram illustrating the first jitter noise insertion block 220-11 according to an example embodiment of the present invention.

Figure 4B:
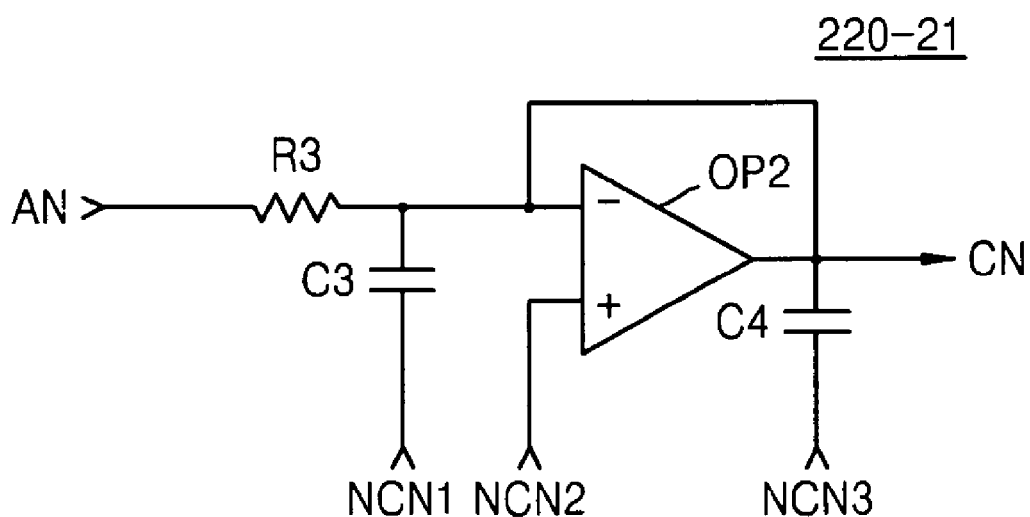
FIG. 4B is a circuit diagram illustrating the second jitter noise insertion block of FIG. 3B according to an example embodiment of the present invention.

FIG. 4B is a circuit diagram illustrating the second jitter noise insertion block 220-21 according to an example embodiment of the present invention.

Figure 4C:
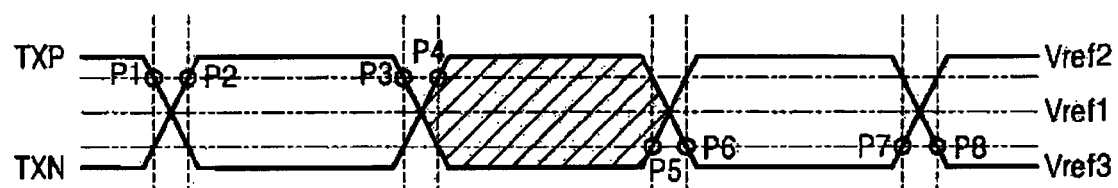
FIG. 4C is a waveform view illustrating the first and second test input signals at two nodes according to another example embodiment of the present invention.

FIG. 4C is a waveform view illustrating the first and second test input signals TXP and TXN at two nodes AP and AN of FIG. 2 according to another example embodiment of the present invention.

Figure 4D:
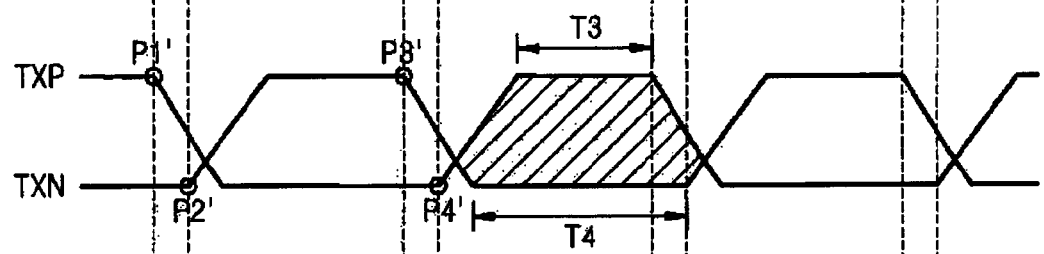
FIG. 4D is a waveform view illustrating the first and second test input signals at two nodes according to another example embodiment of the present invention.

FIG. 4D is a waveform view illustrating the first and second test input signals TXP and TXN at two nodes CP and CN of FIG. 2 according to another example embodiment of the present invention. More specifically, FIG. 4D illustrates an example embodiment where the voltage levels of the second P noise control signal NCP2 and the second N noise control signal NCN2 have the voltage level of a second reference voltage level Vref2. In an example, the second reference voltage level Vref2 may be higher than a voltage level of the first reference voltage level Vref1.

In the example embodiments of FIGS. 4A through 4E, it may be assumed that the voltage levels of the first noise control signal NCP1 and the first N noise control signal NCN1 may be the same. It may be further assumed that the voltage levels of the second P noise control signal NCP2 and the second N noise control signal NCN2 may be the same. It may further be assumed that the absolute values of the second P and N noise control signals NCP2 and NCN2 may vary.

In the example embodiment of FIG. 4D, the voltage level of the first test input signal TXP at the CP node may begin to decrease at a first crossing point P1', wherein the first crossing point P1' corresponds to a point P1 where the first test input signal TXP may intersect with the second reference voltage Vref2. Likewise, the voltage level of the first test input signal TXP at the CP node may begin to increase at a fourth crossing point P4' corresponding to a point P4. The voltage level of the second test input signal TXN may begin to increase at a second crossing point P2' corresponding to a point P2 as shown in the example embodiment of FIG. 4C, and may begin to decrease at a third crossing point P3' corresponding to a point P3.

In the example embodiment of FIG. 4D, the eye pattern generated at the CP node by superposing the two waveforms (e.g., the region filled with diagonal lines) may be different from the eye pattern illustrated in the example embodiment of FIG. 4C. In an example, the asymmetric eye pattern illustrated in the waveform of the example embodiment of FIG. 4D may be indicative of jitter noise.

Figure 4E:
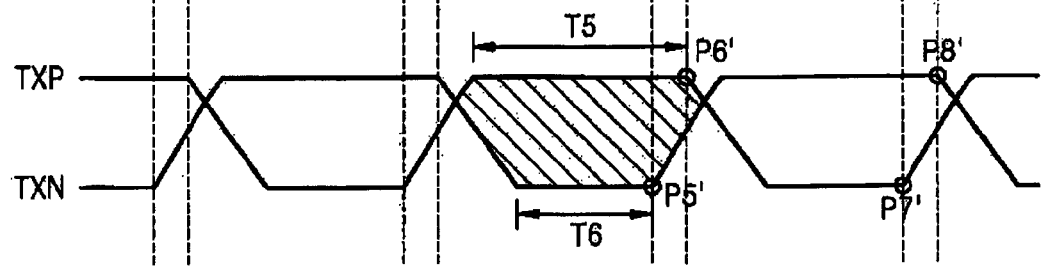
FIG. 4E is a waveform illustrating the first and second test input signals at two nodes according to another example embodiment of the present invention.

FIG. 4E is a waveform illustrating the first and second test input signals TXP and TXN at two nodes CP and CN of the example embodiment of FIG. 2 according to another example embodiment of the present invention. More specifically, FIG. 4D illustrates an example embodiment where the voltage levels of the second P noise control signal NCP2 and the second N noise control signal NCN2 may be set to a third reference voltage level Vref3. In an example, the third reference voltage level Vref3 may be lower than the first reference voltage level Vref1.

In the example embodiment of FIG. 4E, the voltage level of the first test input signal TXP at the CP node may begin to fall at a sixth crossing point P6', corresponding to the point P6, where the first test input signal TXP may intersect with the third reference voltage level Vref3 (e.g., illustrated in the example embodiment of FIG. 4C). The voltage level of the first test input signal TXP may begin to decrease at a seventh crossing point P7', corresponding to the point P7. The voltage level of the second test input signal TXN may begin to increase at a fifth crossing point P5' and may begin to decrease at an eighth crossing point P8'.

In the example embodiment of FIG. 4E, the illustrated eye pattern, generated at the second node CP by superposing the two waveforms (e.g., within the region filled with diagonal lines) may be different than the eye pattern illustrated in the example embodiment of FIG. 4C. In an example, the asymmetric eye pattern illustrated in the waveform of the example embodiment of FIG. 4E may be indicative of jitter noise.

While above-described example embodiments of the present invention have been described wherein the second P noise control signal NCP2 and the second N noise control signal NCN2 have the same voltage levels as each other (, the reference voltages Vref1 to Vref3), the noise control signals NCP2/NCN2 may have different, respective voltage levels in other example embodiments of the present invention.

Figure 5A:
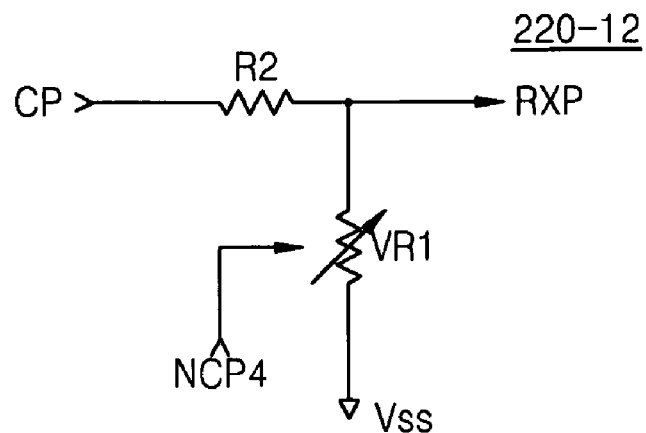
FIGS. 5A and 5B illustrate the first and second level noise insertion blocks of FIGS. 3A and 3B, respectively, according to example embodiments of the present invention.
Figure 5B:
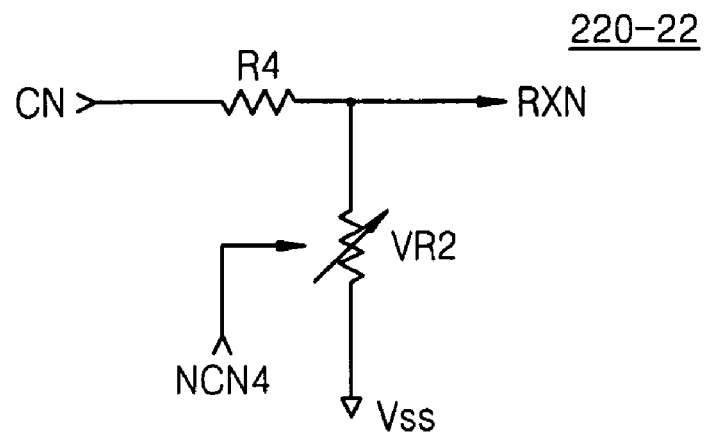

FIGS. 5A and 5B illustrate the first and second level noise insertion blocks 220-12 and 220-22 of FIG. 2 according to an example embodiment of the present invention.

In the example embodiment of FIG. 5A, the first level noise insertion block 220-12 may function as a voltage divider which may be used to determine the voltage level of the first test noise signal RXP based on a ratio of a resistance value of the second resistor R2 to a resistance value of the first variable resistor VR1 arranged between the node CP and the first voltage source VSS. In an example, if the resistance values of the second resistor R2 and the first variable resistor VR1 are set to the same resistance level, the first test noise signal RXP may have a voltage value corresponding to half of the difference between the voltage at the node CP and the first voltage source VSS. In another example, if the resistance value of the second resistor R2 is relatively smaller than that of the first variable resistor VR1, the first test noise signal RXP may have a voltage value larger than half of the difference between the voltage at the node CP and the first voltage source VSS. Accordingly, a signal level applied from the node CP by adjusting the resistance value of the first variable resistor VR1, and herein, such a changed signal is called a signal mixed with level noise.

In the example embodiment of FIG. 5B, the second level noise insertion block 220-22 may function as a voltage divider, similar to the first level noise insertion block 220-12, and as such a detailed description of the example embodiment of FIG. 5B has been omitted for the sake of brevity.

In another example embodiment of the present invention, an HSI test data generator may be configured to add noise (e.g., jitter noise) based on a plurality of noise control signals (e.g., with jitter noise being controlled by noise control signals NCP1 through NCP3 and noise control signals NCN1 through NCN3, and level noise being controlled by noise control signals NCP4 and NCN4). The HSI test data generator according to example embodiments of the present invention may be deployed within an automatic test system. The automatic test system including the example HSI test data generator may be used to verify (e.g., evaluate for correctness) response characteristics of an HSI functional block (e.g., HSI functional block 120) based at least in part on the inserted jitter noise and/or level noise.

Example embodiments of the present invention being thus described, it will be obvious that the same may be varied in many ways. For example, while example embodiments of the present invention have been above-described as directed to adding either jitter noise or level noise into generated test data, it is understood that other example embodiments may be directed towards inserting other types of noise and/or adding other types of delay to generated test data.

Such variations are not to be regarded as a departure from the spirit and scope of example embodiments of the present invention, and all such modifications as would be obvious to one skilled in the art are intended to be included within the scope of the following claims.

What is claimed is:

1. A test data generator, comprising:
   at least one noise insertion block receiving at least a first test input signal and adding noise to the first test input signal, in response to at least two noise control signals, to generate at least a first test noise signal, the at least one noise insertion block including,
      a first noise insertion block receiving the first test input signal and adding the noise to the first test input signal, in response to a first at least one noise control signal, to generate the first test noise signal,
      a second noise insertion block receiving a second test input signal and adding noise to the second test input signal, in response to a second at least one noise control signal, to generate a second test noise signal; wherein
      the noise added by the at least one noise insertion block includes at least one of jitter noise and level noise.

2. The test data generator of claim 1, wherein the first and second test input signals are serial digital signals having opposite phases.

3. The test data generator of claim 1, further comprising:
   a higher speed interface (HSI) sample data generator combining parallel test data signals having a first data rate to generate the first and second test input signals having a second data rate.

4. The test data generator of claim 3, wherein the first data rate is lower than the second data rate.

5. The test data generator of claim 3. wherein the parallel test data signals having the first data rate are generated at an automatic test equipment (ATE) connected to the test data generator.

6. The test data generator of claim 1, wherein the first noise insertion block includes:
   a first jitter noise insertion block generating the first test noise signal by adjusting a phase of the first test input signal in response to the first at least one noise control signal.

7. The test data generator of claim 6, wherein the first jitter noise insertion block includes:
   a first resistor receiving the first test input signal;
   a first capacitor with a first end connected to the first resistor and a second end connected to a first P noise control signal; and
   a first operational amplifier including a first input terminal connected to an output terminal of the first operational amplifier and a common node between the first resistor and the first capacitor, and a second input terminal connected to a second P noise control signal, the first operational amplifier configured to output the first test noise signal through the output terminal.

8. The test data generator of claim 7, wherein the first jitter noise insertion block further includes:
   a second capacitor with a first end connected to the output terminal of the first operational amplifier and a second end connected to a third P noise control signal.

9. The test data generator of claim 8, wherein the second noise insertion block includes:
   a second jitter noise insertion block generating a second test noise signal by adjusting a phase of the second test input signal in response to the second at least one noise control signal.

10. The test data generator of claim 9, wherein the second jitter noise insertion block includes:
    a third resistor receiving the second test input signal;
    a third capacitor with a first end connected to the third resistor and a second end receiving a first N noise control signal; and
    a second operational amplifier having a first input terminal connected to an output terminal of the second operational amplifier and a common node between the third resistor and the third capacitor, a second input terminal receiving a second N noise control signal, wherein the output terminal outputs the second test noise signal.

11. The test data generator of claim 10, wherein the second jitter noise insertion block further includes:
    a fourth capacitor with a first end connected to the output terminal of the second operational amplifier and a second end receiving a third N noise control signal.

12. The test data generator of claim 10, wherein the second jitter noise insertion block further includes:
    a first coupling capacitor with a first end receiving the second test input signal and a second end connected to the third resistor; and
    a second coupling capacitor with a first end connected to the output terminal of the second operational amplifier and a second end outputs the second test noise signal.

13. The test data generator of claim 7, wherein the first jitter noise insertion block further includes:
    a first coupling capacitor with a first end connected to the first test input signal and a second end connected to the first resistor; and
    a second coupling capacitor with a first end connected to the output terminal of the first operational amplifier and a second end connected to the first test noise signal.

14. The test data generator of claim 1, wherein the first noise insertion block includes:
    a first level noise insertion block generating the first test noise signal by adjusting a voltage level of the first test input signal in response to the first at least one noise control signal.

15. The test data generator of claim 1, wherein the first level noise insertion block includes:
- a second resistor receiving the first test input signal; and
- a first variable resistor with a first end connected to the second resistor and a second end connected to a first voltage source, the first variable resistor having a variable resistance value varying in response to a fourth P noise control signal,
- and wherein the first test noise signal is output through a common node between the second resistor and the first variable resistor.

16. The test data generator of claim 15, wherein the first level noise insertion block further includes:
- a first coupling capacitor with a first end receiving the first test input signal and a second end connected to the second resistor; and
- a second coupling capacitor with a first end connected to a common node between the second resistor and the first variable resistor and a second end outputting the first test noise signal.

17. The test data generator of claim 16, wherein the second noise insertion block includes a second level noise insertion block generating the second test noise signal by adjusting a voltage level of the second test input signal in response to the second at least one noise control signal.

18. The test data generator of claim 17, wherein the second level noise insertion block includes:
- a fourth resistor receiving the second test input signal; and
- a second variable resistor with a first end connected to the fourth resistor and a second end connected to a first voltage source,
- wherein the second variable resistor has a resistance value that changes in response to a fourth N noise control signal, and the second test noise signal is output through a common node between the fourth resistor and the second variable resistor.

19. The test data generator of claim 18, wherein the second level noise insertion block further includes:
- a third coupling capacitor with a first end receiving the second test input signal and a second end connected to the fourth resistor, and
- a fourth coupling capacitor with a first end connected to a common node between the fourth resistor and the second variable resistor and a second end outputting the second test noise signal.

20. The test data generator of claim 1, wherein the first noise insertion block includes:
- a first jitter noise insertion block outputting a first phase delay signal, the first phase delay signal generated by adjusting a phase of the first test input signal in response to the first at least one noise control signal; and
- a first level noise insertion block generating the first test noise signal by adjusting a voltage level of the first phase delay signal in response to the first at least one noise control signal.

21. The test data generator of claim 20, wherein the second noise insertion block includes:
- a second jitter noise insertion block outputting a second phase delay signal generated by adjusting a phase of the second test input signal in response to at least a noise control signal; and
- a second level noise insertion block generating the second test noise signal by adjusting a voltage level of the second phase delay signal in response to at least a noise control signal.

22. A test system for testing electrical characteristics of a device, comprising:
- a sample data generator generating serial test data at a first data rate based on parallel test data having a second data rate and outputting first and second test input signals having the first data rate, the first data rate higher than the second data rate; and
- a test data generator receiving the first and second test input signals and generating first and second test noise signals by inserting noise into the first and second test input signals in response to a first and a second at least one noise control signal; wherein
  - the inserted noise includes at least one of litter noise and level noise.

23. The test system of claim 22, wherein the sample data generator is a higher speed interface (HSI) sample data generator.

24. The test system of claim 22, wherein the test data generator generates the first test noise signal by adjusting a phase of the first test input signal and generates the second test noise signal by adjusting a phase of the second test input signal in response to the first at least one noise control signal.

25. The test system of claim 22, wherein the test data generator generates the first test noise signal by adjusting a voltage level of the first test input signal and generates the second test noise signal by adjusting a voltage level of the second test input signal in response to the second at least one noise control signal.

26. The test system of claim 22, wherein an automatic test system generates the parallel test data.

27. The test system of claim 22, wherein the first and second test input signals are digital signals having opposite phases.

28. A method of testing a device, comprising:
- receiving parallel test data at a first data rate;
- converting the received parallel test data into serial test data at a second data rate; and
- selectively inserting at least one type of noise into the converted serial test data in response to at least two noise control signals; wherein
  - the noise includes at least one of jitter noise and level noise.

29. The method of claim 28, wherein the first data rate is lower than the second data rate.

30. A test data generator performing the method of claim 28.

31. A test system performing the method of claim 28.

* * * * *